United States Patent [19]

Sado

[11] 4,252,990
[45] Feb. 24, 1981

[54] ELECTRONIC CIRCUIT PARTS

[75] Inventor: Ryoichi Sado, Saitama, Japan

[73] Assignee: Shin-Etsu Polymer Co., Ltd., Nihonbashi

[21] Appl. No.: 949,160

[22] Filed: Oct. 6, 1978

[30] Foreign Application Priority Data

Oct. 18, 1977 [JP] Japan .................... 52/124831

[51] Int. Cl.$^3$ ............................... H01R 9/00
[52] U.S. Cl. ................ 174/52 R; 174/35 GC; 339/59 M; 339/DIG. 3; 361/308
[58] Field of Search .......... 339/59 M, 60 M, 61 M, 339/DIG. 3, 93 R, 93 C, 93 L; 338/114; 174/35 GC, 52 S, 52 R; 252/511; 361/308, 329, 330

[56] References Cited

U.S. PATENT DOCUMENTS

| | | | |
|---|---|---|---|
| 3,143,692 | 8/1964 | Terry | 361/308 |
| 3,182,238 | 5/1965 | Toder et al. | 361/330 |
| 3,290,571 | 12/1966 | Robinson | 361/308 |
| 3,849,708 | 11/1974 | Leighton | 361/308 |
| 3,883,213 | 5/1975 | Glaister | 339/DIG. 3 X |
| 3,890,546 | 6/1975 | Coleman | 361/329 X |
| 4,003,621 | 1/1977 | Lamp | 339/59 M |
| 4,042,534 | 8/1977 | Andrianov et al. | 252/511 |
| 4,144,648 | 3/1979 | Grovender | 339/DIG. 3 |

Primary Examiner—Elliot A. Goldberg
Assistant Examiner—D. A. Tone

[57] ABSTRACT

An electronic circuit part comprises a solid-state circuit element and at least one pin terminal, which are electrically connected through an intervening elastomeric sheet, which is anisotropically electroconductive in the direction perpendicular to its plane.

3 Claims, 5 Drawing Figures

ELECTRONIC CIRCUIT PARTS

BACKGROUND OF THE INVENTION

The present invention relates generally to electronic circuit parts and particularly to electronic circuit parts comprising a solid-state electronic circuit element.

Various solid-state electronic circuit parts, including resistors, capacitors, oscillators, piezoelectric transducers, thermistors, filters, semiconductor devices, and the like have been used in recent years. These parts typically comprise a solid-state element formed, for example, of a sintered body of a powdery metal or metal oxide, silicon carbide, quartz, a metal oxide, e.g. barium titanate, or a single crystal element, such as high-purity metallic silicon, sapphire and the like.

A typical prior art solid-state electronic circuit part comprises a casing made of metal or plastic, a circuit element with electrodes on its opposite surfaces, and one or more pin terminals put through the casing in an insulating condition. One end of each pin terminal is electrically contacted with the electrode within the casing and the other end is exposed outside. The surface of the electrode with which the end of the pin terminal is contacted is formed either by vacuum evaporation of a metal or by coating with an electroconductive paint. Further, the electrical connection of the end of the pin terminal with the electrode is obtained by direct contact or through a lead wire, most usually with soldering or by other suitable means.

One of the problems that has been encountered in the prior art solid-state circuit parts is that the manufacture of these parts is laborious and time-consuming because of the delicate and complicated assembling work required to connect the individual electrodes with the pin terminals. Moreover, the manufacture or assembly of these parts is not amenable for automated procedures. Another problem in the prior art solid-state circuit part is that the reliability of the electric connection between the electrode and the pin terminal is relatively low due to the extremely delicate nature of the connection. The connection is often liable to breakage or disconnection as a result of mechanical shocks or vibrations when the circuit part or an instrument including the part is handled. This is especially so with piezoelectric transducers in which the element is liable to mechanical vibrations as a matter of its function.

A further problem may be involved in certain resin-molded circuit parts, in which the circuit element is integrally embedded in a synthetic resin to provide protection from mechanical shocks or vibrations. This problem may arise because the molding resins tend to shrink to a relatively large degree during the molding process or the subsequent stage of aging and, as a result, the electric connection between the electrode and the pin terminal often becomes broken, or the lead wire the electrode and pin terminal may be torn. In addition, repeated cycles of heating and cooling of the element during its use exert adverse effects on the durability of the parts concerned, due to the differences between the thermal expansion coefficients of the molding resin and the element per se. Thus, in other words, the prior art electronic circuit part has the disadvantages of a low yield of quality manufacture, a relatively low reliability, and a short serviceable life.

SUMMARY OF THE INVENTION

It is, therefore, an object of the present invention to provide a novel solid-state electronic circuit part which is free from the above-described problems and disadvantages encountered in the prior art.

The solid-state electronic circuit part in accordance with the present invention comprises (a) a casing, (b) at least one pin terminal put through the casing in an insulating state, one of its ends staying within the casing and the other end outside, (c) a solid-state circuit element placed in the casing and having at least one electrode on its surface facing the end of the pin terminal, and (d) a sheet member positioned in press-contact between the electrode and the end of the pin terminal, and formed of an anisotropically electroconductive elastomer having a direction of electrical conduction in parallel with a line connecting the end of the pin terminal with the electrode, or substantially perpendicular to the surface of the sheet member, whereby electrical conduction is established between the solid-state circuit element and the pin terminal.

The sheet member formed of an anisotropically electroconductive elastomer may have electrically conductive fibers embedded and oriented in about the same direction within an electrically non-conducting elastomeric material as the matrix. Such anisotropically electroconductive elastomeric sheets may be prepared by a known method, for example, as disclosed in Japanese Patent Disclosure No. 52-65892. According to this method, an electrically non-conducting elastomer in a plasticized state, e.g. a silicone rubber, is blended with an electrically conductive fibrous material, e.g. carbon fibers or metal fibers, to form a plastic mass, and the plastic mass is subjected to plastic deformation in one direction, whereby the conductive fibers become oriented within the matrix in about the same direction, followed by curing. The resulting cured elastomer is then sliced to have planes in a direction substantially perpendicular to the orientation of the conductive fibers.

In the preparation of the anisotropically conductive sheets which are suitable for use in the present invention, the kind of non-conductive elastomeric material and conductive fibers is not critical. However, an elastomeric material and conductive fiber that are advantageous for use in the present invention is a combination of a silicone rubber and carbon fibers in order to establish more reliable and durable electrical connection between the electrode and the end of the pin terminal. The carbon fibers may preferably have a diameter ranging from 3 to 30 $\mu$m and the density of these fibers in the sheet product is preferably in the range from 30 to 200 pieces in terms of monofilament per $mm^2$, so that the sheet is imparted with a sufficient electrical conduction and, at the same time, a rubber-like elasticity, to ensure that the surface of the sheet makes a resilient contact with the electrode or the end of the pin terminal. The sheet is, preferably, as hard as from 40 to 70 as measured in accordance with Japanese Industrial Standard K 6301, and as thick as at least 0.1 mm, enough to provide an appropriate cushioning effect.

According to the present invention, the anisotropically electroconductive sheet member is placed between the electrode and the end of the pin terminal in a manner such that these three members are press-contacted and firmly fixed inside the casing, so that a resilient, electrical connection is formed between the electrode and the end of the pin terminal by virtue of the sheet member having conductive fibers extending from one surface to the other.

Thus, the present invention has the advantage of obviating of the most troublesome soldering process which has been required in the prior art fabrication techniques and from the assembling work of the electronic parts, and also enables an unexpectedly enhanced productivity as compared to the conventional processes. Further, according to the present invention, an appropriate cushioning effect produced by the sheet member serves to absorb the energy of mechanical shocks or fibrations, which otherwise would adversely affect the performance of the parts, and to maintain the reliability of the electrical connection between the electrodes and the pin terminals, thus contributing to an extension of the useful life of the products.

The present invention will be further illustrated with reference to the accompanying drawings, in which.

Figure 1:
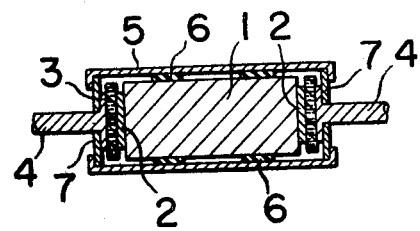
FIG. 1 is a schematic cross sectional view of a solid-state electronic circuit part according to an embodiment of the present invention.

In the embodiment of the invention illustrated in FIG. 1, the solid-state element has two electrodes, one on each of its opposing surfaces; each electrode contacts a pin terminal through a sheet member. In the embodiments shown in FIGS. 2 and 3, the solid-state element has two electrodes facing each other and contacting a pair of pin terminals through a single sheet member. In the embodiment of FIG. 3, the electrodes are press-contacted to the sheet member in an oblique direction.

Figure 2:
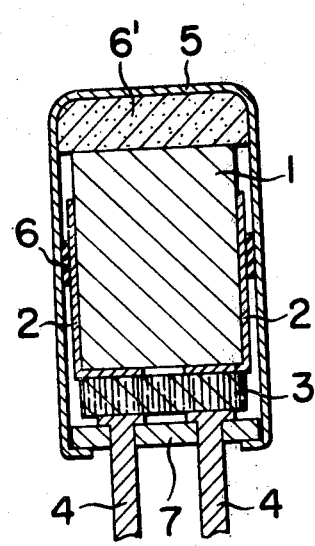
FIGS. 2 and 3 are schematic cross sectional views of a solid-state electronic circuit part according to the invention.
Figure 3:
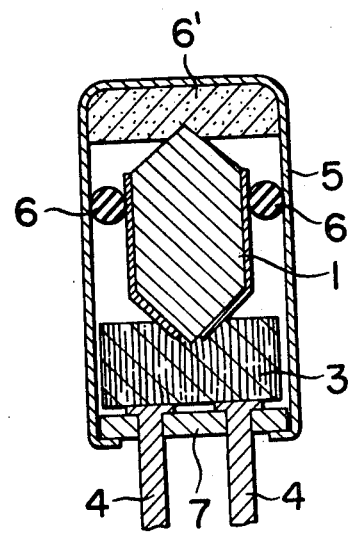

The solid-state electronic parts illustrated in FIGS. 1 to 3 include a solid-state circuit element 1, and an electrode 2, which is integrally provided on a surface of element 1 by vacuum evaporation of a metal, coating with an electroconductive paint, or by other suitable means. A sheet member 3 of an anisotropically electroconductive elastomer, which has a conducting direction perpendicular to its plane, is interposed between electrode 2 and a pin terminal 4, one end of which contacts the surface of sheet members 3 and the other end extends outside of a casing 5. A spacer 6, e.g. an O-ring, holds element 1 in its proper position inside casing 5, and a terminal plate 7 made of an insulating material closes casing 5 and includes openings for allowing pin terminal 4 to project through it.

Spacer 6' is also made of an elastic material to serve as a cushion for holding element 1 together with the anisotiopically electroconductive sheet member 3.

Figure 4A:
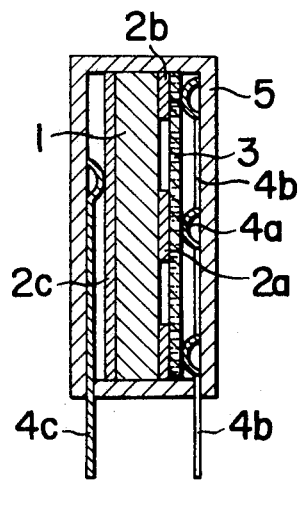
FIGS. 4a and 4b are views of a solid-state electronic circuit part according to another embodiment of the invention, FIG. 4a being a cross sectional view and FIG. 4b a plan view with the cover of the casing removed.
Figure 4B:
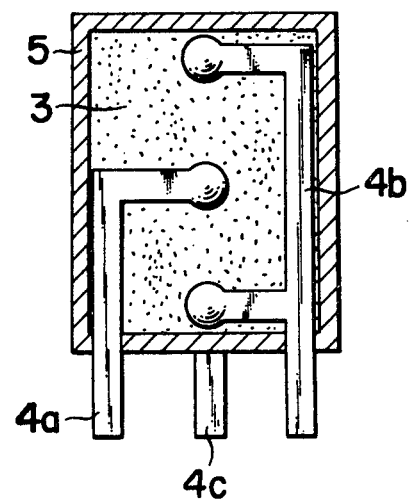

In each of the embodiments of FIGS. 1-3, sheet member 3 is embedded with a plurality of conductive fibers, which are oriented in about the same direction parallel with the line connecting the surface of electrode 2 and the end of pin terminal 4, the ends of the conductive fiber being exposed on both surfaces of sheet member 3, so that electrode 2 and pin terminal 4 are electrically connected through sheet member 3. In the embodiment of FIGS. 4a and 4b, the solid-state element has three electrodes, electrodes 2a and 2b being positioned on the same surface of the solid-state element and the other electrode 2c being positioned on the opposite surface. Electrodes 2a and 2b contact pin terminals 4a and 4b, respectively, through the sheet member 3. Electrode 2c contacts pin terminal 4c directly. In this embodiment the end of each of the pin terminals 4a and 4b, which are in contact with the surface of the sheet member 3 and the pin terminal 4c, which is in direct contact with the electrode 2c, is shaped in the form of a rounded, thin and springy metallic cup so as to make the contact in a better condition, giving further reliability of electrical connection between each pin terminal and electrode 2a, 2b or 2c. The resilient end of each pin terminal and elastomeric sheet member 3 covering all surfaces of element 1 render it unnecessary to use such spacers 6 as shown in FIGS. 1–3. Further the terminal plate as shown in the embodiments of FIGS. 1–3 is not necessary since each pin terminal is tightly inserted into casing 5.

The structure of the electronic circuit parts according to the present invention is not limited specifically to those depicted in the figures. Casings 5 shown in the embodiments of FIGS. 1–3 form and are cylindrical in the peripheral opening ends of the casings, between which pin terminal 4 is to be inserted, are bent tward the inside, and terminal plate 7 is put firmly on the bent ends. It is also feasible for terminal plate 7 to be fixed between both peripherical opening ends by means of male and female screws, instead of being put on the bent ends. A further alternative would be to provide a flange at each opening end of casing 5 and to fix terminal plate 7 to the flanges with screws or bolts and nuts.

Casing 5 may be made of metal or plastic from the viewpoint of achieving electrostatic shielding or prevention of external interference. Element 1, in the embodiments of FIGS. 1–3 is kept apart from the inner surfaces of casing 5 by the aid of spacers 6 of a suitable form, preferably rubber or elastic foamed plastic so that the cooperative cushioning effects of the two elastic members, i.e. sheet member 3 and spacers 6 ensure further improved resistance to shocks and vibrations. The use of spacers 6 between element 1 and the inner surfaces of casing 5 may be substituted by providing electrically insulating coating films either on the inner surface of casing 5 or on the surface of element 1.

As has been described in the foregoing, the electronic circuit parts according to the present invention have a structure such that electrical conduction between the electrodes provided on the element and the pin terminals is obtained by press-contacting both of them through the elastomeric sheet member having anisotropic electroconductivity, and thereby increased productivity can be attained over the conventional assembling work in which a troublesome soldering process is required. Thus, great practical advantages are imparted to the electronic circuit parts of the present invention together with improved resistance to shocks and vibrations.

What is claimed is:

1. An electronic circuit part comprising:
   (a) a casing,
   (b) at least two pin terminals extending through and insulated from said casing, one end of each of said pin terminals being within said casing and the other end being outside of said casing, (c) a solid-state circuit element placed in said casing and having at least two electrically isolated electrodes on its surface, each electrode facing an end of said pin terminals, and (d) a sheet member positioned between said electrodes and an end of said pin terminals, and formed of an anisotropically electroconductive elastomer having a direction of electric conduction in parallel with a line connecting an end of said pin terminals with said electrodes, or substantially perpendicular to the surface of said sheet member, whereby electrical conduction is established between said solid-state circuit element and said pin terminals.

2. The electronic circuit part as claimed in claim 1, wherein said sheet member is a silicone rubber matrix in which a plurality of carbon fibers are oriented in about the same direction substantially perpendicular to the surface of said sheet member.

3. The electronic circuit part as claimed in claims 1 or 2, further comprising an elastomeric spacer element interposed between said solid-state circuit element and said casing.

* * * * *